United States Patent
Talledo (10) Patent No.: US 9,842,828 B1
(45) Date of Patent: Dec. 12, 2017

(54) STACKED SEMICONDUCTOR PACKAGE WITH COMPLIANT CORNERS ON FOLDED SUBSTRATE

(71) Applicant: STMICROELECTRONICS, INC., Calamba (PH)

(72) Inventor: Jefferson Talledo, Calamba (PH)

(73) Assignee: STMICROELECTRONICS, INC., Calamba (PH)

( * ) Notice: Subject to any disclaimer, the term of this patent is extended or adjusted under 35 U.S.C. 154(b) by 0 days.

(21) Appl. No.: 15/181,116

(22) Filed: Jun. 13, 2016

(51) Int. Cl.
*H01L 25/065* (2006.01)
*H01L 23/498* (2006.01)
*H01L 25/00* (2006.01)
*H01L 23/00* (2006.01)
*H01L 23/31* (2006.01)
*H01L 21/56* (2006.01)

(52) U.S. Cl.
CPC .......... *H01L 25/0657* (2013.01); *H01L 21/56* (2013.01); *H01L 23/3114* (2013.01); *H01L 23/4985* (2013.01); *H01L 23/49838* (2013.01); *H01L 24/29* (2013.01); *H01L 24/83* (2013.01); *H01L 25/50* (2013.01); *H01L 2224/29191* (2013.01); *H01L 2225/06517* (2013.01)

(58) Field of Classification Search
CPC ............. H01L 25/0657; H01L 23/4985; H01L 23/3114; H01L 21/56; H01L 21/58
See application file for complete search history.

(56) References Cited

U.S. PATENT DOCUMENTS

| 7,154,175 B2 | 12/2006 | Shrivastava et al. | |
|---|---|---|---|
| 8,034,661 B2 | 10/2011 | Lin et al. | |
| 2009/0016032 A1* | 1/2009 | Chow | H01L 25/03 361/749 |
| 2010/0038765 A1* | 2/2010 | Byun | H01L 23/49816 257/686 |
| 2012/0261814 A1* | 10/2012 | Slavov | H01L 23/5387 257/737 |
| 2014/0138851 A1* | 5/2014 | Kim | H01L 25/0652 257/777 |
| 2014/0197531 A1* | 7/2014 | Bolognia | G06K 9/0002 257/693 |
| 2016/0190072 A1* | 6/2016 | Talledo | H01L 23/13 257/693 |

* cited by examiner

*Primary Examiner* — Michael Jung
(74) *Attorney, Agent, or Firm* — Seed Intellectual Property Law Group LLP (57) ABSTRACT

One or more embodiments are directed to stacked packages, such as Package-on-Package (PoP) packages, that are stacked on a flexible folded substrate. The stacked packages have compliant corners. In particular, the stacked packages include an adhesive material at the corners between layers of the folded substrate. The adhesive material has a low modulus of elasticity, such as, for example, a modulus of elasticity of silicone adhesive. The low modulus of elasticity of the adhesive material produces compliant corners of the stacked package. The adhesive material fills openings between the folded substrate that are formed around a bottom semiconductor package of the stack package. In that regard, the bottom semiconductor package may have pulled back or recessed corners and the adhesive material fills the openings formed by the recessed corners. The recessed corners may be any size or shape.

20 Claims, 7 Drawing Sheets

STACKED SEMICONDUCTOR PACKAGE WITH COMPLIANT CORNERS ON FOLDED SUBSTRATE

BACKGROUND

Technical Field

Embodiments of the present disclosure related to stacked semiconductor packages and methods of forming same.

Description of the Related Art

Ongoing demand for smaller electronic devices pressures manufacturers of such devices to increase component density and reduce component size wherever possible within the device. Semiconductor fabricators have responded by increasing the use of chip scale packaging and wafer level packaging techniques to minimize the footprint of the semiconductor package, at times reducing the package to a size approaching the size of the semiconductor die itself. In particular, the use of direct surface mountable ball grid arrays and flip chip configurations has been implemented, thereby reducing semiconductor package sizes.

Space on a printed circuit board (PCB) has been conserved by vertically stack packages to form a stacked package, also referred to as a Package-on-Package (PoP) package. Stacked packages are packages that are stacked vertically and include one or more top packages vertically stacked over a bottom package. Stacked packages are typically more rigid that individual packages and in some case may cause warpage due to the rigidity and differing coefficients of thermal expansion of the varying materials within the stacked package. The rigidity of the stacked packages can result in decreased solder reliability when the package is coupled to the PCB.

BRIEF SUMMARY

One or more embodiments are directed to stacked packages, such as Package-on-Package (PoP) packages, that are stacked on a flexible folded substrate. The stacked packages have compliant corners that in some embodiments reduce rigidity of the stacked package. In particular, the stacked packages include an adhesive material at the corners of the stack, such as between layers of the folded substrate. The adhesive material has a low modulus of elasticity, such as for example a modulus of elasticity of silicone adhesive. The low modulus of elasticity of the adhesive material produces compliant corners of the stacked package and accommodates at least some of the warpage that may typically be induced in the stacked package. Furthermore, the adhesive improves the life of the conductive bumps at the corners of the stacked package when the stacked package is coupled to another device, such as PCB.

In at least one embodiment, adhesive material fills openings between the folded substrate that are formed around a bottom semiconductor package of the stack package. In that regard, the bottom semiconductor package may have pulled back or recessed corners and the adhesive material fills the openings formed by the recessed corners. The recessed corners and the adhesive material in the openings may be any size or shape.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

It will be appreciated that, although specific embodiments of the present disclosure are described herein for purposes of illustration, various modifications may be made without departing from the spirit and scope of the present disclosure.

In the following description, certain specific details are set forth in order to provide a thorough understanding of various aspects of the disclosed subject matter. However, the disclosed subject matter may be practiced without these specific details. In some instances, well-known structures and methods of semiconductor processing, such as semiconductor power devices, comprising embodiments of the subject matter disclosed herein have not been described in detail to avoid obscuring the descriptions of other aspects of the present disclosure.

Figure 1A:
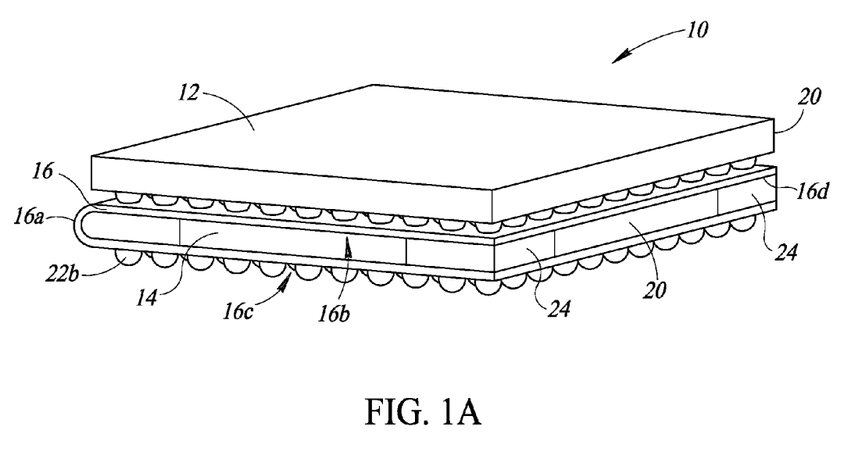
FIGS. 1A-1C illustrate various views of a stacked package in accordance with one embodiment.
Figure 1B:
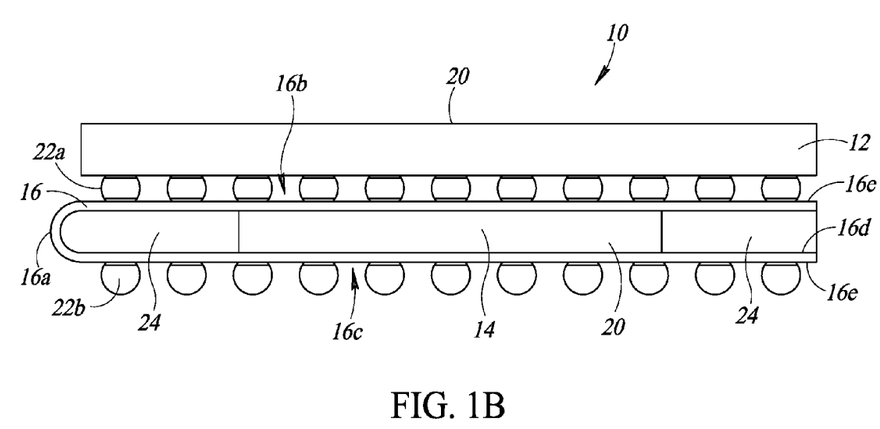
Figure 1C:
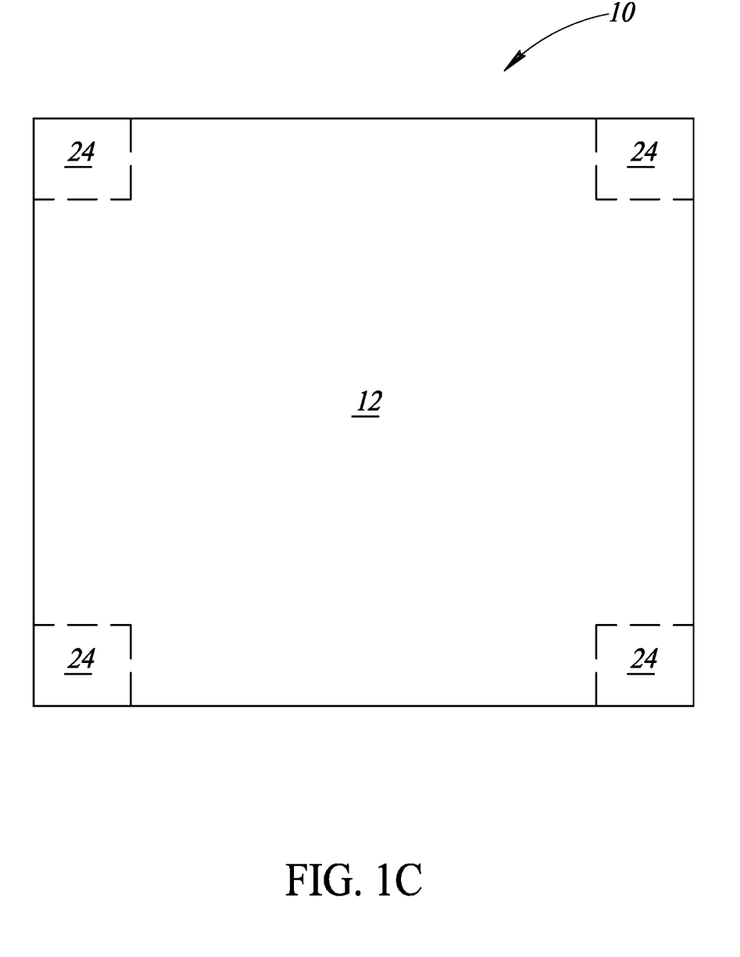

FIG. 1A is an isometric view of a Package-on-Package (PoP) package, or stacked package 10 in accordance with one embodiment. FIG. 1B is a side view of the stacked package 10, while FIG. 1C is a top view of the stacked package 10 illustrating recessed corners of a bottom package in dashed lines, as will be explained in detail below.

The stacked package 10 includes a top semiconductor package 12 and a bottom semiconductor package 14 that are coupled to a folded flexible substrate 16. The top and bottom semiconductor packages 12, 14 include one or more semiconductor chips 30 (FIG. 4A) integrating one or more electrical components, such as integrated circuits, as is well known in the art. The integrated circuits may be analog or digital circuits implemented as active devices, passive devices, conductive layers, and dielectric layers formed within the chip and electrically interconnected according to the electrical design and function of the chips.

Around the semiconductor chips 30 is encapsulation material 20, which is a dielectric material that protects electrical components therein, such as the semiconductor chip and conductive wires or bumps, from external environmental sources of damage, such as corrosion, physical damage, moisture damage, or other causes of damage to electrical components. The encapsulation material 20 may be a molding compound, such as a polymer resin. Although only two semiconductor packages are shown in the stacked package, it is to be appreciated that the stacked package may include a greater number of semiconductor packages in the stack and may further include more folds in the flexible substrate or another substrate.

The flexible substrate 16 electrically and mechanically couples the top and bottom semiconductor packages 12, 14 together. The flexible substrate 16 is folded at a fold portion 16a to form an upper portion 16b and a lower portion 16c. The top semiconductor package 12 is directly coupled to the upper portion 16b of the flexible substrate 16 and the bottom semiconductor package 14 is directly coupled to the lower portion 16c of the flexible substrate 16.

The flexible substrate 16 includes conductive contacts, conductive traces, and insulative material as is well known in the art. In particular, the flexible substrate includes conductive contacts on the upper and lower portions 16b, 16c. Various conductive contacts are coupled together on the flexible substrate 16 by the conductive traces, which extend through the fold portion 16a of the flexible substrate 16 as is well known in the art. In that regard, one or more conductive contacts of the upper portion 16b are coupled to conductive contacts of the bottom portion 16c by conductive traces that extend through the folded portion 16a of the flexible substrate 16. The insulative material of the flexible substrate 16 isolates various conductive components therein.

The flexible substrate 16 has inner and outer surfaces 16d, 16e. The inner and outer surfaces 16d, 16e are located on both the upper and lower portions 16b, 16c of the flexible substrate 16. The top semiconductor package 12 is coupled to the conductive contacts of the outer surface 16e of the upper portion 16b of the flexible substrate 16 by a first set of conductive bumps 22a, such as solder bumps. The first set of conductive bumps 22a are coupled to one or more electrical components of the semiconductor chip within the top semiconductor package 12, as is well known in the art.

The inner surface 16d of the flexible substrate 16 faces first and second surfaces of the bottom semiconductor package 14. In particular, the inner surface 16d of the flexible substrate 16, at the upper portion 16b thereof, faces the second surface of the bottom semiconductor package 14, and the inner surface 16d of the lower portion 16c of the flexible substrate 16 faces the first surface of the bottom semiconductor package 14. The bottom semiconductor package 14 is electrically coupled to conductive contacts on the inner surface 16d of the lower portion 16c of the flexible substrate 16. In particular, electrical components of the semiconductor chip inside the bottom semiconductor package 14 are coupled to the conductive contacts of the inner surface 16d of the lower portion 16c of the flexible substrate 16. For instance, the semiconductor chip may be coupled by conductive bumps in a flip chip configuration or by conductive wires as is well known in the art.

Figure 2:
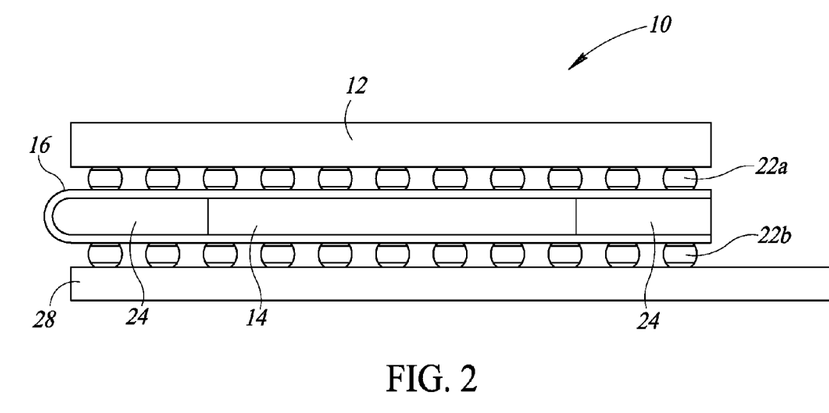
FIG. 2 illustrates a side view of the stacked package of FIGS. 1A-1C coupled to a PCB.

A second set of conductive bumps 22b, such as solder balls, are formed on the conductive contacts on the outer surface 16e of the lower portion 16c of the flexible substrate 16. The second set of conductive bumps 22b are configured to couple the stacked package to another device, such as a PCB 28, as shown in FIG. 2. As will be clear to persons of ordinary skill in the art, the semiconductor chips in the top and bottom semiconductor packages 12, 14 are electrically coupled to electrical components of the PCB 28 by the second set of conductive bumps 22b on the lower portion 16c of the flexible substrate 16. The PCB 28 is part of an electronic device, which may be any electronic device, such as a smart phone, notebook, or any other electronic device, including those that are part of a larger device.

At the corners of the stacked package 10, between the inner surfaces 16d of the upper and lower portions 16b, 16c of the flexible substrate 16, is an adhesive material 24. The adhesive material 24 is any adhesive material having a low Young's modulus, such as the Young's modulus of silicone adhesives. For instance, in one embodiment the Young's modulus of the adhesive material is between about 0.001 to 0.05 GPa. In particular, the Young's modulus of the adhesive material is less than the Young's modulus of the encapsulation material 20 of the semiconductor packages. In that regard, the adhesive material 24 is an elastic material that allows the stacked package 10 to be more compliant, particularly at the corners of the stacked package, thereby providing a package with compliant corners. Due to the adhesive material 24 being of an elastically deformable material, warpage of the stacked package 10 is thereby reduced. Additionally, the compliant corners of the stacked package 10 extend the life the conductive bumps, particularly the second set of conductive bumps 22b, of the stacked package, as will be explained in more detail with reference to FIG. 5. Furthermore, the adhesive material 24 aids in mechanically coupling the upper and lower portions 16b, 16c of the flexible substrate 16 together. In one embodiment, the adhesive material 24 is silicone or a silicone based adhesive.

The adhesive material 24 fills openings 34 (FIG. 4C) formed by recesses in the bottom semiconductor package 14 between the upper and lower portions 16b, 16c of the flexible substrate 16. In particular, the bottom semiconductor package 14 has recessed corners 33 (FIG. 4C) that create openings 34 at the corners of the stacked package 10 between the upper and lower portions 16b, 16c of the flexible substrate 16. More particularly, the encapsulation material 20 of the bottom semiconductor package 14 includes recessed corners 33 as best shown in FIG. 4C. The adhesive material 24 fills, or at least substantially fills, the recessed corners of the bottom semiconductor package 14 in the area between the upper and lower portions 16b, 16c of the flexible substrate 16.

FIG. 1C illustrates the shape of the adhesive material 24 in dashed line, which in the illustrated embodiment is square. The adhesive material 24 fills the recessed corners of the bottom semiconductor package 14, which may have any variety of shapes, such as triangular, rectangular, or any other suitable shape.

In operation of the stacked package 10, the top and bottom semiconductor packages 12, 14 are in electrical communication with the PCB 28 through the flexible substrate 16 and the first and second sets of conductive bumps 22b. One or both of the top and bottom semiconductor packages 12, 14 may also be configured to communicate with the other through the flexible substrate 16.

As mentioned above, the stacked package 10 with the adhesive material 24 filled corners provides improve board level reliability (BLR) after board mount. The flexibility of the adhesive material 24 can relieve stress in the stacked package 10, which has been determined to be highest at its corners. The adhesive material 24 between the upper and lower portions 16b, 16c of the flexible substrate 16 extends the life of the first and/or second sets of conductive bumps 22 after the stacked package 10 has been coupled to another device or the PCB 28. In particular, the adhesive material 24 absorbs stress applied to the conductive bumps 22 at the corners of the stacked package 10. Thus, rather than the conductive bumps 22 cracking, the adhesive material 24 elastically deforms and relieves stress in the package, thereby reducing warpage in the package.

Figure 3:
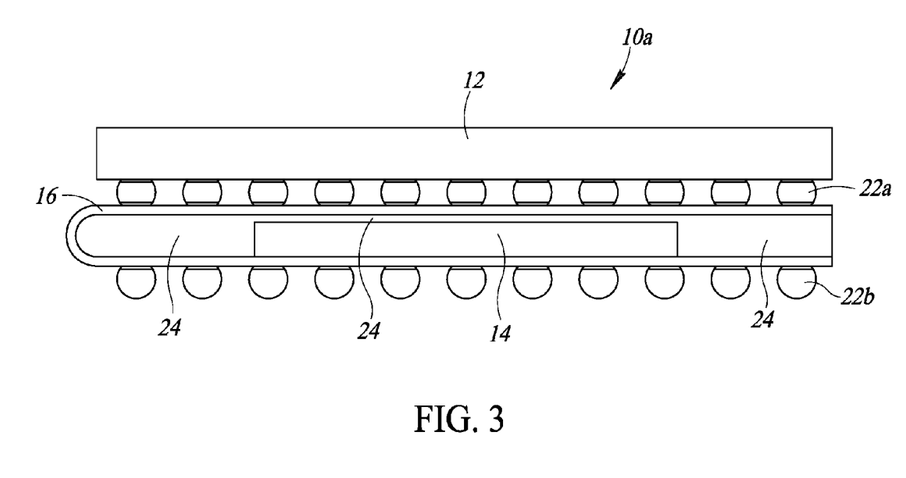
FIG. 3 illustrates a side view of a stacked package in accordance with another embodiment.

FIG. 3 illustrates a side view of a stacked package 10a in accordance with another embodiment. The stacked package 10a of FIG. 3 is substantially the same as the stacked package 10 of FIG. 1, except that the adhesive material 24 in the stacked package 10a of FIG. 3 not only fills the openings in the corners between the upper and lower portions 16b, 16c of the flexible substrate 16, but is also located between the bottom semiconductor package 14 and the upper portion 16b of the flexible substrate 16. That is, the adhesive material 24 fills the openings formed by the recessed corners of the bottom package 14 as described in reference to FIGS. 1A-1C and a portion of the adhesive 24 is between the back surface of the bottom package 14 and the upper portion 16b of the flexible substrate 16. The portion of the adhesive material between the back surface of the bottom package 14 and the inner surface 16d of the upper portion 16b of the flexible substrate 16 aids in adhering the upper portion 16b of the flexible substrate 16 to the bottom semiconductor package 14 and/or the lower portion 16c of the flexible substrate 16. The portion of the adhesive material 24 may also provide increased elasticity of the stacked package 10a that addresses the warpage issues and relieves conductive bump cracks.

FIGS. 4A-4G illustrate cross-sectional views of various stages of an assembly process for forming a stacked package, such as the stacked package of FIG. 1A-1C, in accordance with an embodiment of the present disclosure.

Figure 4A:
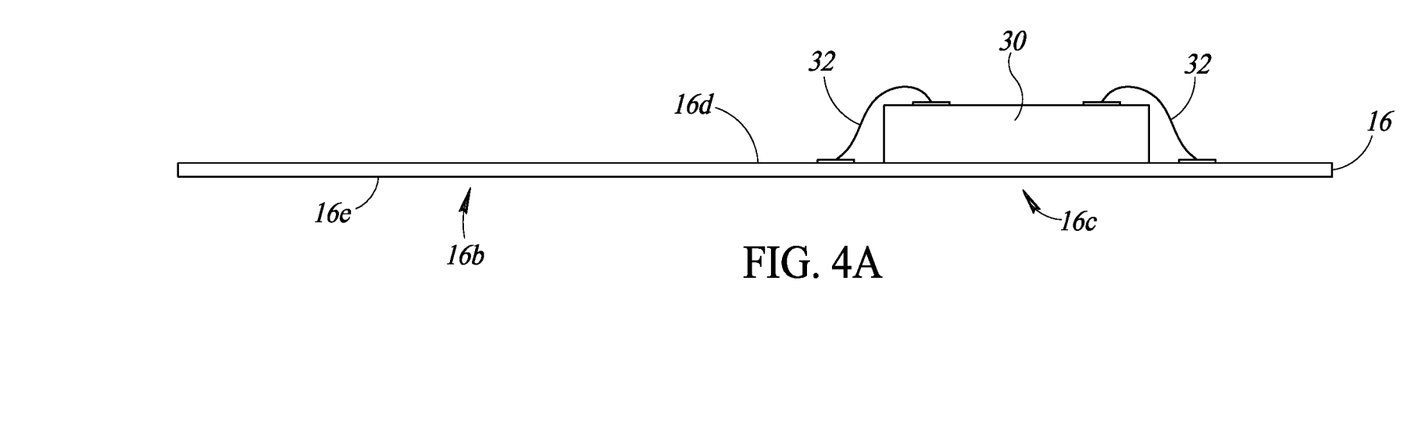
FIGS. 4A-4G illustrate cross-section views of various stages of an assembly process for forming a stacked package, such as the stacked package of FIGS. 1A-1C, in accordance with an embodiment of the present disclosure.

As shown in FIG. 4A a semiconductor chip 30 is placed on the inner surface 16d of the lower portion 16c of the flexible substrate 16 and is electrically and mechanically coupled thereto. In particular, a first surface of the semiconductor chip 30 may be coupled to the inner surface 16d of the lower portion 16c of the flexible substrate 16. A second surface of the semiconductor chip 30 faces upward in FIG. 4A. The second surface of the semiconductor chip 30 is an active surface of the chip that includes the electrical components discussed above. First ends of conductive wires 32 are coupled to bond pads of the active surface of the semiconductor chip 10, and second ends of the conductive wires 32 are coupled to conductive contacts of the flexible substrate 16.

Although not shown, the semiconductor chip 30 may be coupled to the inner surface 16d of the lower portion 16c of the flexible substrate 16 by flip chip arrangement as well. That is, conductive bumps may be coupled between the bond pads of the active surface of the semiconductor chip 30 and the conductive contacts of the flexible substrate 16 as is well known in the art.

Figure 4B:
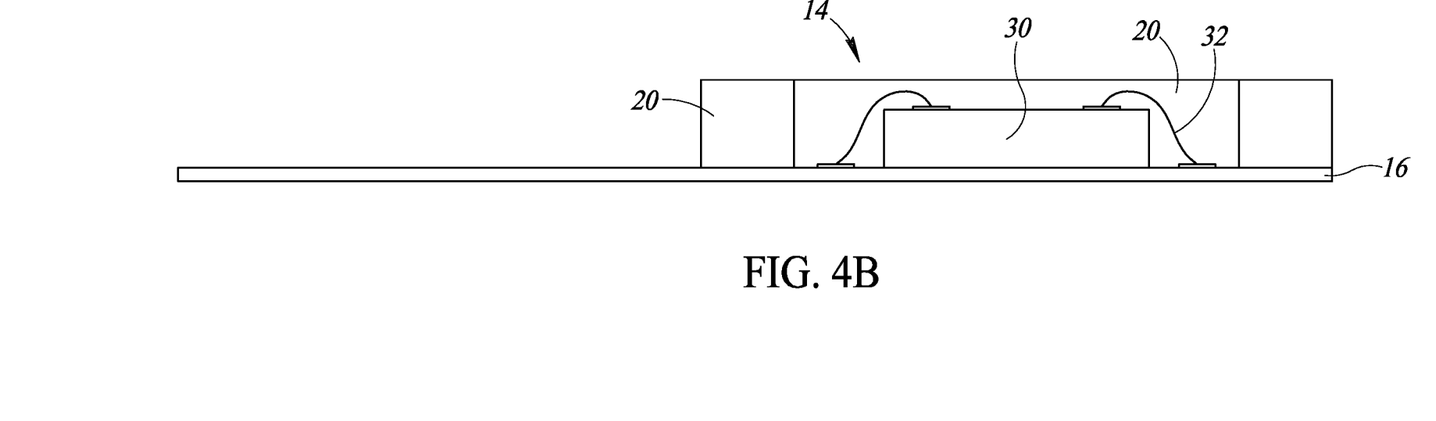
Figure 4C:
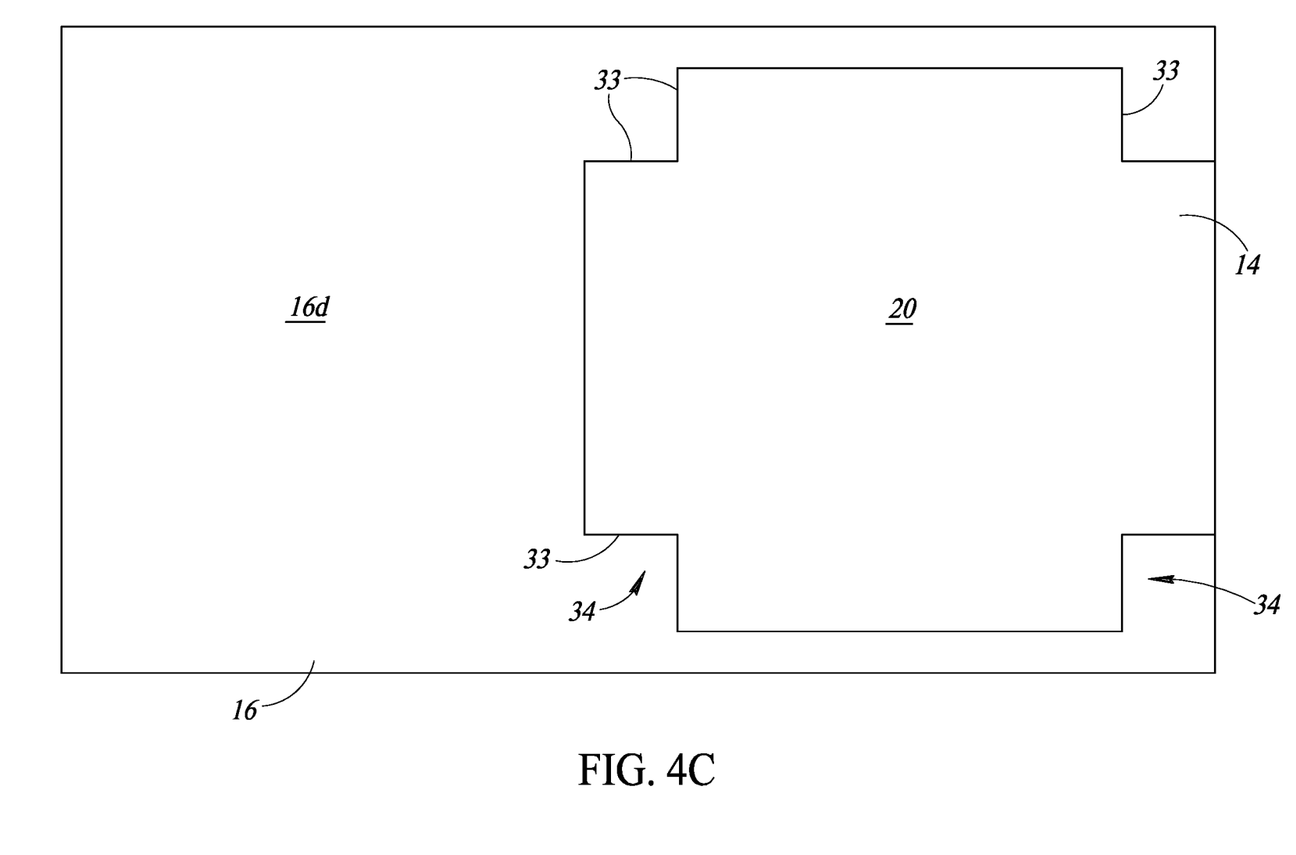

As shown in FIG. 4B, the semiconductor chip 30 is encapsulated with encapsulation material 20 to form the bottom semiconductor package 14. In particular, a molding step may be performed in which a molding compound, such as resin, is introduced into a mold which holds the flexible substrate 16 and semiconductor chip 30. The molding compound flows around the semiconductor chip 30 and the conductive wires and hardens over time. The hardening process may include one or more curing steps. The bottom semiconductor package 14 is formed to have recessed corners 33 for forming the openings 34 as shown in FIG. 4C. For instance, the mold is shaped to form the encapsulation material 20 with the recessed corners 33 such that openings 34 remain at the corners of the package. FIG. 4C shows the bottom semiconductor package 14 in plan view and illustrates the openings 34 and the recessed corners 33 at each of the four corners of the package.

Figure 4D:
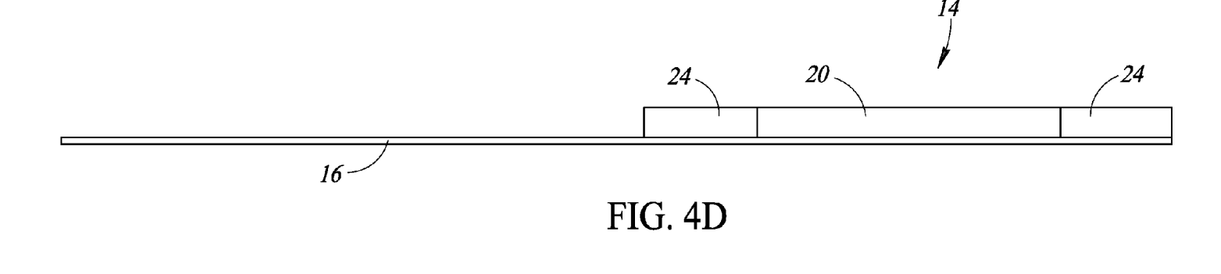

As shown in FIG. 4D, the adhesive material 24 is dispensed in the openings 34 formed by the recessed corners 33 of the bottom semiconductor package 14. For instance, silicone is deposited in the openings 34. The adhesive material 24 hardens over time. In one embodiment, the adhesive material 24 may involve a curing step to harden.

In some embodiments, the steps shown in FIGS. 4A-4D are performed for a plurality of semiconductor chips so that a plurality of bottom semiconductor packages 14 are formed on a single flexible substrate strip or array. In such an embodiment, the flexible substrate may go through a dicing operation, which may include sawing, laser, or punching to separate into individual flexible substrates.

Figure 4E:
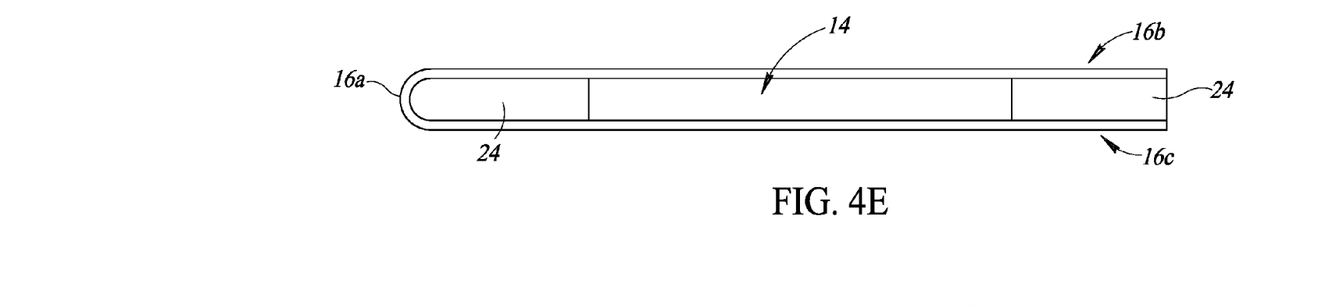

As shown in FIG. 4E, the upper portion of the flexible substrate 16 is folded over a second surface of the bottom semiconductor package 14 and the adhesive material 24 to form the fold portion 16a. The adhesive material 24 in the openings 34 adheres the upper portion 16b of the flexible substrate 16 to the lower portion 16c of the flexible substrate 16.

Figure 4F:
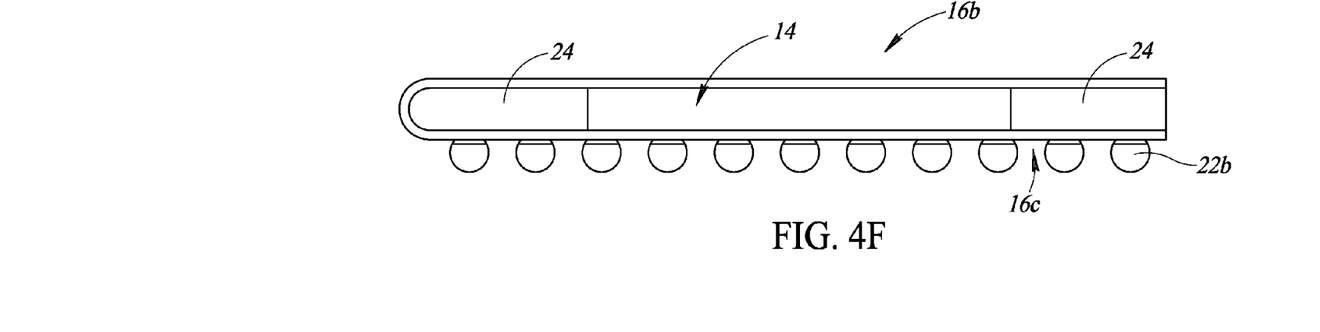

As shown in FIG. 4F, the second set of conductive bumps 22b are formed on the conductive contacts of the outer surface of the lower portion 16c of the flexible substrate 16 using standard semiconductor bump forming techniques.

Figure 4G:
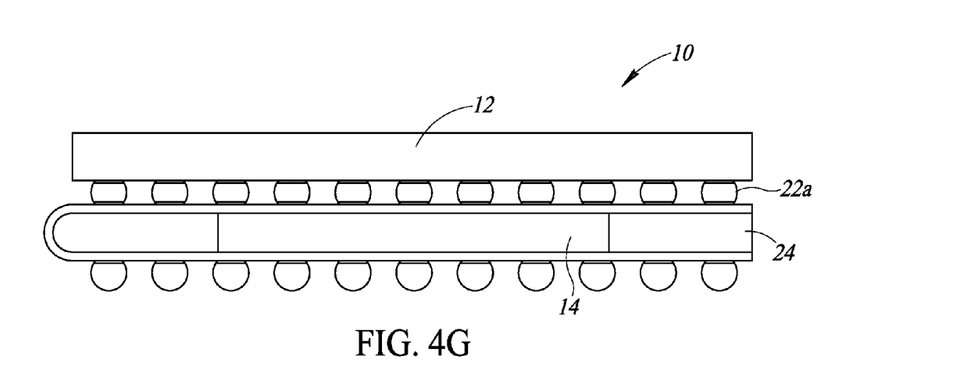

As shown in FIG. 4G, a top semiconductor package 12 is coupled to the outer surface 16e of the upper portion 16b of the flexible substrate 16 using the first set of conductive bumps 22a. The top semiconductor package 12 is any previously formed semiconductor package. The details of forming the top semiconductor package 12 are well known in the art and are not being provided herein in the interest of brevity. The first set of conductive bumps 22a may be first formed on either the conductive contacts on the outer surface 16e of the upper portion 16b of the flexible substrate 16 or on leads or contacts of the top semiconductor package 12 itself. Upon placing the flexible substrate 16 and the top semiconductor package 12 together with the first set of conductive bumps 22a there between, the first set of conductive bumps 22a may undergo a reflow step that causes the first set of conductive bumps 22a to reflow and adhere to the conductive contacts of the flexible substrate 16 and the top semiconductor package 12 as known in the art.

The assembly process may be performed in a different order than is described above. For instance, the top semiconductor package 12 may be coupled to the upper portion 16b of the flexible substrate 16 prior to folding the flexible substrate.

Figure 5:
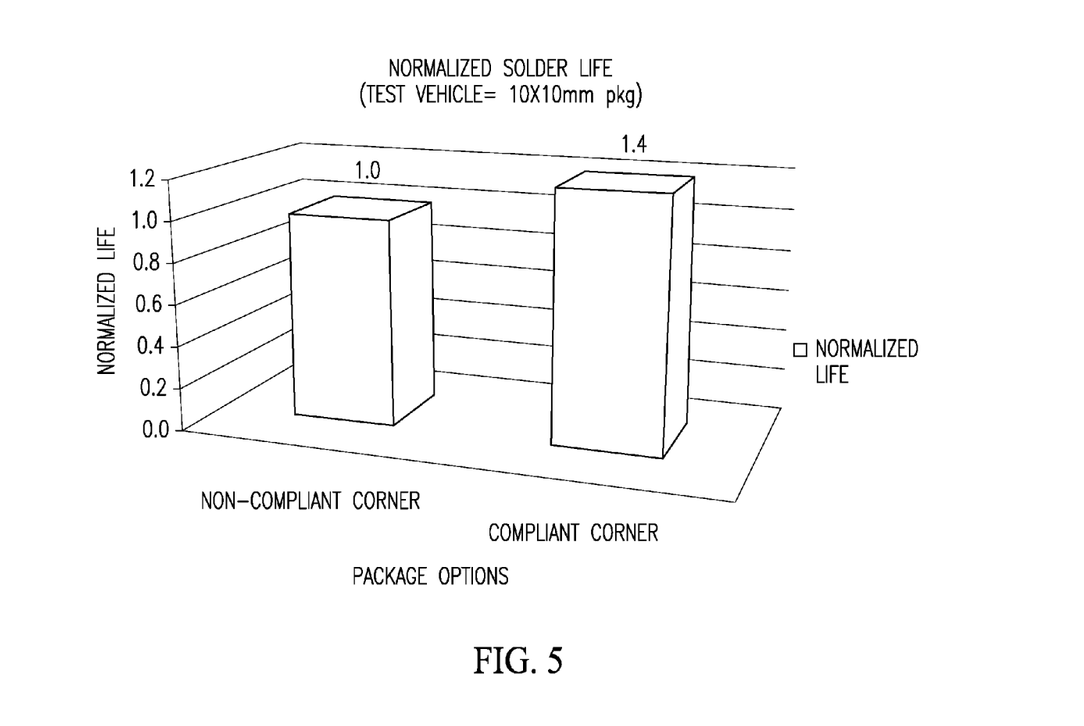
FIG. 5 is a table comparing solder life of a semiconductor package with compliant corners, such as the package of FIGS. 1A-1C, with a package without compliant corners.

FIG. 5 shows a graph illustrating a comparison of the life of the conductive bumps of stacked packages with compliant corners in accordance with the embodiment of FIGS. 1A-1C to the life of the conductive bumps of stacked package without compliant corners in accordance with the related art. As shown in the graph, the conductive bumps stacked packages with compliant corners have a longer life, thereby improving board reliability of the stacked package.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A stacked semiconductor package, comprising:
   a flexible substrate having first and second surfaces, the first and second surfaces including conductive contacts, the flexible substrate being folded and forming an upper portion and a lower portion;

a first semiconductor package located between the upper and lower portions of the flexible substrate, the first semiconductor package having an outer body that has recessed corners;

adhesive material located at the recessed corners, the adhesive material coupling the upper and lower portions of the flexible substrate together; and a second semiconductor package coupled to the upper portion of the flexible substrate.

2. The stacked semiconductor package of claim 1 wherein the adhesive material includes silicone.

3. The stacked semiconductor package of claim 1 wherein the adhesive material has a first Young's modulus and the first semiconductor package includes an encapsulation material having a second Young's modulus that is greater than the first Young's modulus, wherein the encapsulation material of the first semiconductor package has the recessed corners.

4. The stacked semiconductor package of claim 1 wherein the recessed corners of the first semiconductor package form at least one of square-shaped openings, triangular-shaped openings, and rectangular-shaped openings.

5. The stacked semiconductor package of claim 1 wherein the adhesive material is located at corners of the stacked semiconductor package.

6. The stacked semiconductor package of claim 1, comprising adhesive material between a back surface of the first semiconductor package and the upper portion of the flexible substrate.

7. The stacked semiconductor package of claim 1 wherein the stacked semiconductor package is coupled to a printed circuit board.

8. A method, comprising:

coupling a first semiconductor chip to a first surface of a first portion of a flexible substrate;

encapsulating the first semiconductor chip with an encapsulation material to form a first semiconductor package having recessed corners, wherein portions of the first surface of the first portion of the flexible substrate remain exposed by the recessed corners;

placing an adhesive material in the portions exposed by the recessed corners of the first surface of the first portion of the flexible substrate; and folding a second portion of the flexible substrate over the first portion of the flexible substrate.

9. The method of claim 8, further comprising coupling a second semiconductor package to the second portion of the flexible substrate to form a stacked package.

10. The method of claim 9, further comprising coupling the stacked package to a printed circuit board using conductive bumps.

11. The method of claim 8 wherein the adhesive material is a silicone adhesive material.

12. The method of claim 8 wherein the adhesive material adheres the first and second portions of the flexible substrate together.

13. The method of claim 8 wherein the recessed corners of the first semiconductor chip are one of square, rectangular, or triangular shaped.

14. The method of claim 8 wherein placing adhesive material in the portions of the first surface of the first portion of the flexible substrate includes placing adhesive on a back surface of the first semiconductor package.

15. An electronic device, comprising:

a printed circuit board;

conductive bumps coupled to the printed circuit board; and a semiconductor package coupled to the conductive bumps, the semiconductor package including:

a folded flexible substrate forming inner and outer surfaces that include conductive contacts and upper and lower portions;

a first semiconductor package located between the upper and lower portions of the folded flexible substrate and electrically coupled to the conductive contacts of the inner surface of the lower portion of the folded flexible substrate, the first semiconductor package including recessed corners at an outer perimeter of the first semiconductor package;

an adhesive material located at the recessed corners and coupling the upper and lower portions of the folded flexible substrate together; and a second semiconductor package electrically coupled to a first set of the conductive contacts on the outer surface of the folded flexible substrate, the first set of conductive contacts being on the upper portion of the folded flexible substrate.

16. The electronic device of claim 15 wherein the semiconductor package is coupled to the conductive bumps on the outer surface and the lower portion of the folded flexible substrate.

17. The electronic device of claim 15 wherein a first set of the conductive bumps are on the outer surface at the lower portion of the folded flexible substrate and the adhesive material is on the inner surface at the lower portion of the folded flexible substrate so that the first set of conductive bumps are opposite the adhesive material.

18. The electronic device of claim 15 wherein the adhesive material is silicone.

19. The electronic device of claim 15 wherein the adhesive material when hardened is a more elastic than an encapsulation material of the first semiconductor package when hardened.

20. The electronic device of claim 15 wherein the first semiconductor package includes encapsulation material and the recessed corners are formed in the encapsulation material.

* * * * *